United States Patent
Su

(10) Patent No.: US 6,627,501 B2
(45) Date of Patent: Sep. 30, 2003

(54) METHOD OF FORMING TUNNEL OXIDE LAYER

(75) Inventor: Chin-Ta Su, Yunlin (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 10/041,622

(22) Filed: Jan. 10, 2002

(65) Prior Publication Data

US 2002/0177276 A1 Nov. 28, 2002

(30) Foreign Application Priority Data

May 25, 2001 (TW) .................................. 90112716 A
May 25, 2001 (TW) .................................. 90112717 A

(51) Int. Cl.$^7$ ........................................... H01C 21/336
(52) U.S. Cl. ........................................ 438/263; 438/264
(58) Field of Search ................................ 438/263, 264, 438/163, 267

(56) References Cited

U.S. PATENT DOCUMENTS

| | | | | |
|---|---|---|---|---|
| 5,817,581 A | * | 10/1998 | Bayer et al. ................. | 438/770 |
| 5,851,892 A | * | 12/1998 | Lojek et al. ................. | 438/305 |
| 5,943,592 A | * | 8/1999 | Tsukamoto et al. ......... | 438/486 |
| 6,171,911 B1 | * | 1/2001 | Yu .............................. | 438/275 |
| 6,207,591 B1 | * | 3/2001 | Aoki et al. .................. | 438/795 |
| 6,348,420 B1 | * | 2/2002 | Raaijmakers et al. ....... | 438/769 |
| 6,455,344 B1 | * | 9/2002 | Lee ............................. | 438/57 |

* cited by examiner

Primary Examiner—Carl Whitehead, Jr.
Assistant Examiner—William Vesperman
(74) Attorney, Agent, or Firm—Dickinson Wright PLLC

(57) ABSTRACT

A method of forming a tunnel oxide layer is disclosed. The method of the present invention uses the rapid thermal process (RTP) rather than the conventional furnace process. The silicon dioxide ($SiO_2$) film served as the tunnel oxide layer is formed on single wafer by utilizing the rapid thermal oxidation (RTO) method, and the tunnel oxide layer is annealed in-situ by utilizing the rapid thermal annealing (RTA) method to improve the quality of the tunnel oxide layer. Therefore, the time of forming the tunnel oxide layer can be decreased, and the thermal budget of the process can be reduced. Further, the uniformity of the tunnel oxide layer can be enhanced, and not only the contamination but also the consumed manpower and time resulted from changing chamber can be avoided.

4 Claims, 2 Drawing Sheets

METHOD OF FORMING TUNNEL OXIDE LAYER

FIELD OF THE INVENTION

The present invention relates to a method of forming a tunnel oxide layer, and more particularly, to a method of forming a tunnel oxide layer by utilizing the rapid thermal oxidation (RTO) method and annealing the tunnel oxide layer in-situ by utilizing the rapid thermal annealing (RTA) method.

BACKGROUND OF THE INVENTION

Generally, according to the difference in accessing functions, the memory devices can be divided into random access memory (RAM) and read only memory (ROM), wherein RAM must keep the supplying power uninterruptedly for reserving the stored data and is thus called as a volatile memory, and ROM does not lose the stored data even with the break of supplying power and is thus called as a nonvolatile memory. In addition, according to the varieties of the ways for storing data, ROM can be further divided into mask read only memory (MROM), programmable ROM (PROM), erasable programmable ROM (EPROM), electrically erasable programmable ROM (EEPROM), and flash memory, etc. Because the data stored in a non-volatile memory can be kept after the power is shut off, non-volatile memory device is applied widely in the industries of computer and electronics. Particularly, as the increasing popularization of portable electric devices, such as notebook computer and telecommunication equipment, etc., and the increasing device integration, the technical demands for electrically erasable programmable ROM and flash memory, which can be accessed like disk drives, is increasing day by day.

Referring to FIG. 1, it shows a cross-sectional view of a flash memory cell. In the flash memory cell, a tunnel oxide layer 16, floating gate 18, dielectric layer 20, and control gate 22 are stacked in order on a P-type substrate 10, and the N-type drain 12 and source 14 are formed under the upper surface of substrate 10, wherein the composition of tunnel oxide layer 16 can be, for example, silicon dioxide ($SiO_2$), and the composition of the floating gate 18 and control gate 22 can be, for example, poly-silicon, and the composition of dielectric layer 20 can be, for example, silicon dioxide or silicon nitride ($Si_3N_4$).

If the source 14 and the substrate 10 are connected to ground, and the control gate 22 and the drain 12 are applied with high-voltage electricity, the carrier multiplication phenomenon will occur between the N-type drain 12 and the P-type substrate 10. A portion of the hot electrons resulted from the carrier multiplication phenomenon are absorbed by the drain 12, and the other potion of them pass through the tunnel oxide layer 16 and into the floating gate 18, so as to make the floating gate 18 charged. Because there is a potential barrier in the composition of tunnel oxide layer 16 and dielectric layer 20 that connect to the floating gate 18, the electrons within the floating gate 18 cannot escape but stay in the floating gate 18. While a voltage is applied to the control gate 22 for accessing the data in the aforementioned flash memory cell, with the charged floating gate 18, data "1" is stored. On the other hand, with no electron staying within the floating gate 18, data "0" stored in the flash memory cell. As to deleting the data stored in memory cell, by applying an appropriate negative voltage to the control gate 22, the electrons within floating gate 18 are induced to leave floating gate 18 through the tunnel oxide layer 16, and thereby the data stored in the flash memory cell is deleted.

In the memory cells of EEPROM and flash memory, the written/erased action of data are performed by prompting hot electrons passing through the tunnel oxide layer to get enter/exit from the floating gate. Thus, the quality of electricity of the tunnel oxide layer has great influence on the stability of memory device, and the reliability of device is lowered by many impurities or charges, and the unnecessary variation of electricity is induced.

The stability of electricity of thermal oxide layer, such as tunnel oxide layer, etc., is influenced principally by the increase of charge concentration of oxide layer resulted from the trapped charges induced during the operation of device by impurity defects or unsaturated bonding of the interface between silicon substrate and oxide layer, so that the charges are kept within the oxide layer. In order to lower the charge concentration in the oxide layer, after the oxide layer is formed, an annealing process is used to lower the concentration of impurity defects or unsaturated bonding, so that the amount of trapped charge is decreased, and the charge concentration of oxide layer is lowered.

Generally, most of the silicon dioxide for the tunnel oxide layer is formed and annealed with the use of a thermal oxidation furnace by the furnace process. An annealing process is a kind of metal smelting technique in wide application, and the annealing principle is to use thermal energy to increase the energy of lattice atoms and material defects, so that vibration and diffusion of lattice atoms and defects are increased, and the arrangement of atoms of material is rearranged, and the material defect of are lowered. In virtue of the disappearance of defects, recrystallization is performed, and further grain growth is performed. The purpose of the annealing process is to eliminate the material defects and rearrange the structure of material, so after the oxide layer is formed, the annealing process can be applied to eliminate the defects of oxide layer and enhance the quality of electricity of oxide layer.

Referring to FIG. 2, FIG. 2 shows a cross-sectional view of a conventional thermal oxidation furnace for forming and annealing the tunnel oxide layer. Thermal oxidation furnace 100 is mainly composed of a quartz tube 102 that has been annealed by high-temperature heating, a heater 104, and thermocouples (not shown) used for measuring the furnace tube temperatures.

For forming a silicon dioxide film served as the tunnel oxide layer with the use of a thermal oxidation furnace 100, about from 100 to 150 pieces of substrate 106 are first put on boats 112 made of, for example, quartz, and then into a thermal oxidation furnace 100, wherein an appropriate amount of nitrogen ($N_2$) is injected into the thermal oxidation furnace 100 through a gas inlet 108. Then, after the temperature of thermal oxidation furnace 100 is raised, oxygen ($O_2$) and hydrogen ($H_2$) followed are injected into the thermal oxidation furnace 100 to form a silicon dioxide film by thermal oxidation, wherein for the prevention of hydrogen explosion caused by the hydrogen accumulated in the thermal oxidation furnace 100, the amount of oxygen must be at least greater than a half of the amount of hydrogen, and the gas after reaction has to be exhausted through the gas outlet 110. Then, hydrogen and oxygen are stopped being injected into the thermal oxidation furnace 100, and the system temperature is lowered with the use of nitrogen.

Subsequently, the thermal oxidation furnace 100 is used to anneal the tunnel oxide layer, and a reactive gas, such as nitrogen, is injected into the thermal oxidation furnace 100 through the gas inlet 108. The temperature of the thermal oxidation furnace 100 is raised to an appropriate high temperature by the use of heater 104, and substrate 106 is placed at the high-temperature environment for a period of time. At this time, the lattices of the atoms of the tunnel oxide layer on substrate 106 are rearranged with the thermal energy resulting from the high temperature. Subsequently, after the temperature of the thermal oxidation furnace 100 is lowered, substrate 106 is taken out of the thermal oxidation furnace 100, and the process of forming the tunnel oxide layer is completed.

Although more than one hundred of substrates can be treated simultaneously by forming and annealing silicon dioxide film with the use of furnace process for performing thermal process, yet it takes quite a long time for the process to be completed, which is around several hours, and thus not only the process efficiency is lowered but also the thermal budget is enhanced. Consequently, the process cost is increased.

SUMMARY OF THE INVENTION

According to the aforementioned conventional method for forming and annealing a tunnel oxide layer, while a silicon dioxide film is formed to be the tunnel oxide layer by utilizing the furnace process, for it takes a lot of time for completing the process, which results in the lower process efficiency, and the overwhelming process thermal budget, the process cost is increased.

Accordingly, one of major objects of the present invention is to provide a method of forming a tunnel oxide layer, and the method of the present invention is to utilize the rapid thermal process to form a silicon dioxide film served as the tunnel oxide layer on single wafer, so as to reduce the reactive time and thus enhance the throughput.

Another object of the present invention is to provide a method of forming a tunnel oxide layer, and the method of the present invention is to use the rapid thermal process to form the silicon dioxide film served as the tunnel oxide layer on single wafer by rapid thermal oxidation. Hence, not only the growth rate of silicon dioxide film is increased, but also the process efficiency is enhanced, and further the quality of the film is more uniformed.

A further object of the present invention is to provide a method of annealing a tunnel oxide layer, and the method of the present invention is to use the rapid thermal oxidation process to form a tunnel oxide on a single wafer, and in the same chamber use the rapid thermal annealing process to anneal the tunnel oxide in-situ. Thus, the reactive time can be reduced, and the process thermal budget can be lowered significantly, so that the production cost can be reduced. Further, the quality of the tunnel oxide layer can be enhanced, and not only the contamination but also the consumed manpower and time resulted from changing chamber can be avoided.

Based on the objects decreased above, the present invention is to provide a method of forming a tunnel oxide layer, and the method of the present invention is to utilize the rapid thermal oxidation of the rapid thermal process. Firstly, substrate are taken into a rapid heater, after the temperature is adjusted to the preset value, nitrogen is injected into the rapid heater. Then, a first reactive temperature of rapid heater is raised to between about 850° C. and about 1100° C., and a first reactive gas comprising oxygen and hydrogen is injected into the rapid heater to perform the thermal oxidation reaction, wherein the flow ratio of hydrogen to the combination of hydrogen and oxygen is adjusted to between about 1% and about 33%, and the process pressure is maintained between about 5 torr and about 15 torr. After the thermal oxidation reaction is completed, the supply of hydrogen and oxygen are stopped, and the temperature of the rapid heater is decreased rapidly to the preset value with the use of nitrogen.

Subsequently, a second reactive gas comprising nitrogen and oxygen, is injected into the rapid heater, wherein the flow rate of nitrogen is between about 5 sccm and about 10 sccm, and the flow rate of oxygen is between about 0.2 sccm and about 0.5 sccm. Then, a second reactive temperature of the rapid heater is raised to between about 850. and about 1100., and the process pressure is maintained between about 700 torr and about 760 torr, and the substrate is maintained under the second reactive temperature for approximately dozens of seconds. During this period, the lattice positions of the atoms of the tunnel oxide layer on the substrate are rearranged by utilizing thermal energy resulting from high temperature. Subsequently, the temperature of the rapid heater is decreased rapidly to the preset value, the substrate is taken out, and the process for forming the tunnel oxide layer is completed. With the rapid heater of the rapid thermal process, the chamber of the rapid thermal process can be heated to the temperature required for the thermal process in seconds, and after the reaction is completed, the temperature can then be lowered to the preset value at an amazing speed. With the application of the present invention, the processing time is quite short, thus it not only has advantages of lowering thermal budget, lowering cost and increasing process throughput, but also a tunnel oxide layer with better uniformity is further obtained.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Because the thickness of tunnel oxide layer applied in electrically erasable programmable ROM and flash memory is quite thin, and the quality of the tunnel oxide layer has great influence on the accessing of memory cells, it is the major scope of the present invention to form a silicon dioxide having the desired thickness and the high quality as the tunnel oxide layer of memory cells.

Tunnel oxide layer of the present invention is first formed on the substrate put in a rapid heater by utilizing the rapid thermal oxidation process, and then the rapid thermal annealing process is performed in the same rapid heater to improve the quality of the tunnel oxide layer.

Figure 1:
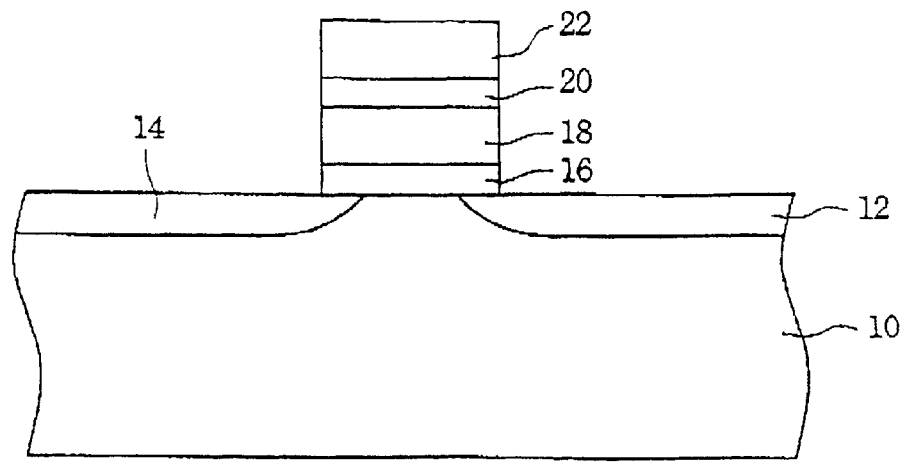
FIG. 1 is a cross-sectional view of a flash memory cell.
Figure 2:
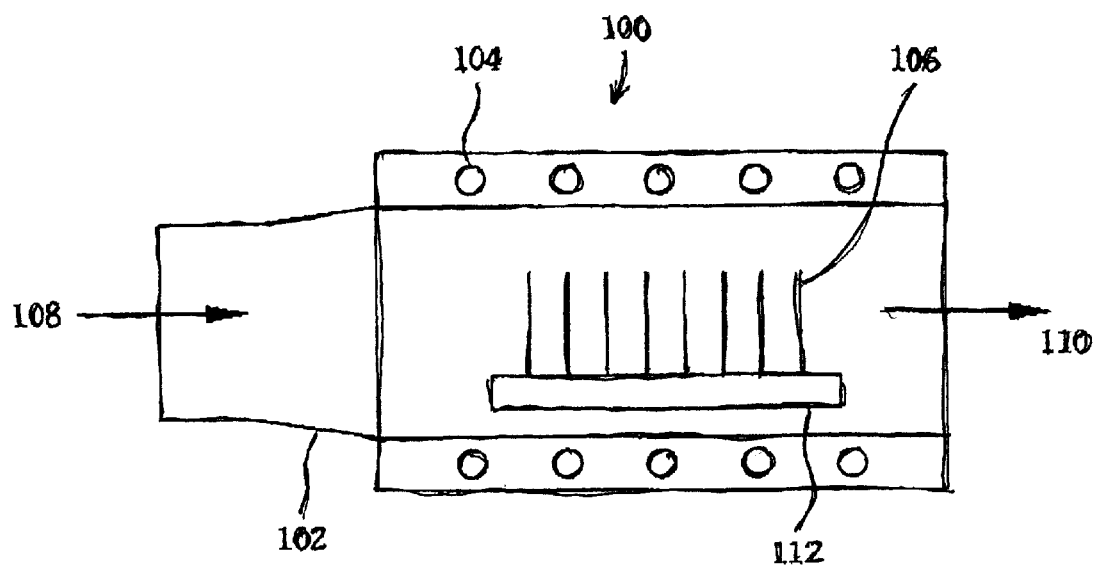
FIG. 2 is a cross-sectional view of a conventional thermal oxidation furnace for forming and annealing a tunnel oxide layer.
Figure 3:
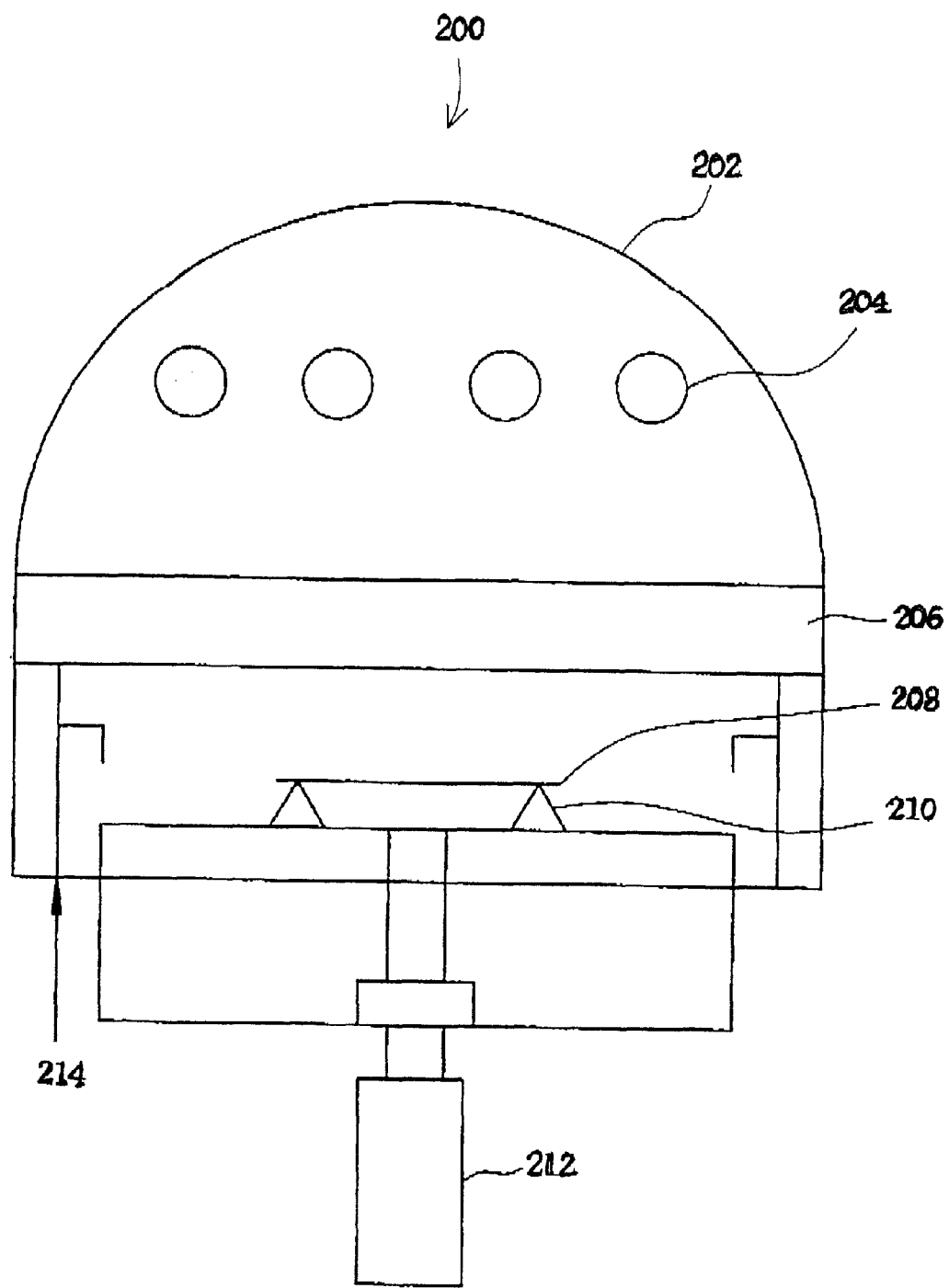
FIG. 3 is a cross-sectional view of a rapid heater for forming and annealing a tunnel oxide layer in accordance with a preferred embodiment of the present invention.

Referring to FIG. 3, FIG. 3 shows a cross-sectional view of a rapid heater for forming and annealing a tunnel oxide layer in accordance with a preferred embodiment of the present invention. Rapid heater 200 of the rapid thermal process comprises a reflector 202, an illuminator 204, a quartz window 206, and an optical pyrometer 212, wherein the illuminator 204 is used for rapid heating, and the reflector 202 is used to reflect the light emitted by the illuminator 204 to the direction needed for heating, and the quartz window 206 is used for the optical radiation emitted from the illuminator 204 to be passed through so as to illuminate the substrate 208, and the optical pyrometer 212 is used to control the temperature of rapid heater 200. While a silicon dioxide film is formed on the substrate 208 to be used as the tunnel oxide layer by rapid thermal oxidation performed by the rapid heater 200, the substrate 208 is first located on a wafer support 210 of the rapid heater 200, and the temperature is adjusted to the preset value, and then nitrogen is injected into the rapid heater 200 through a gas inlet 214, wherein the substrate support 210 is made of quartz typically. Thereafter, a first reactive temperature of rapid heater 200 is raised to between about 850° C. and about 1100° C., and a first reactive gas comprising oxygen and hydrogen is then injected to perform the thermal oxidation reaction to form a silicon dioxide film on the substrate 208, wherein the flow ratio of hydrogen to the combination of hydrogen and oxygen is controlled at a predetermined value, and the predetermined value is between about 1% and about 33%, and the processing pressure is maintained between about 5 torr and about 15 torr. After a silicon dioxide film is formed by thermal oxidation, the supply of hydrogen and oxygen are stopped, and nitrogen is injected to lower the temperature of the rapid heater 200 to the preset value rapidly.

At that time, the temperature of the rapid heater 200 is set at a preset value, so the substrate 208 is not transferred to another chamber, and a second reactive gas is injected into the rapid heater 200 through a gas inlet 214, wherein the second reactive gas comprises nitrogen and oxygen, and the flow rate of nitrogen is between about 5 sccm and about 10 sccm, and the flow rate of oxygen is between about 0.2 sccm and about 0.5 sccm. Thereafter, the second reactive temperature of the rapid heater 200 is raised to between about 850. and about 1100. with the use of the illuminator 204, and the processing pressure is maintained between about 700 torr and about 760 torr. The substrate 208 is maintained under the second reactive temperature for approximately dozens of seconds, and during this period, the lattice position of the atoms of the tunnel oxide layer and between the tunnel oxide layer and the substrate 208 is rearranged by utilizing thermal energy supplied by the illuminator 204. After the temperature of the rapid heater 200 is lowered to the preset value rapidly, the substrate 208 is subsequently taken out the rapid heater 200 for completing the process for forming the tunnel oxide layer.

The temperature of the substrate 208 in the rapid heater 200 can be raised to the temperature required for the thermal oxidation process and the thermal annealing process in seconds by the rapid heater 200. After the process is finished, the temperature can be lowered to the preset value in seconds with an amazing speed. Further, it takes only about dozens seconds for forming a silicon dioxide film by thermal oxidation, and it also takes only about dozens seconds for annealing the silicon dioxide film. Therefore, comparing to the furnace process that takes several hours, the thermal budget of the rapid thermal process is very lower, and the overall throughput of the rapid thermal process is better than that of the furnace process.

One advantage of the present invention is to provide a method of forming a tunnel oxide layer, and instead of the conventional furnace process, the method of the present invention uses a rapid thermal process for forming a silicon dioxide film as the tunnel oxide layer of memory cells. The time-consumption of the rapid thermal process is much less than that of the furnace process, and the process can be performed with better quality control. With the application of the present invention, by reducing the time for forming the tunnel oxide layer, the process efficiency and the throughput are promoted, and further, the quality of the tunnel oxide layer is also enhanced. Hence, the production cost is reduced.

A further advantage of the present invention is to provide a method of forming a tunnel oxide layer, and after a tunnel oxide layer is formed by the use of a rapid thermal oxidation process, the method of the present invention uses a rapid thermal annealing process in-situ for a single wafer to improve the quality of electricity of the tunnel oxide layer. Thus, the reactive time for annealing the tunnel oxide layer can be reduced, and not only the contamination but also the consumed manpower and time resulted from changing chamber can be avoided, so that the production cost can be reduced. Further, the quality of the tunnel oxide layer can be enhanced.

As is understood by a person skilled in the art, the foregoing preferred embodiments of the present invention are illustrations of the present invention rather than limitations of the present invention. It is intended to cover various modifications and similar arrangements included within the spirit and scope of the appended claims, the scope of which should be accorded the broadest interpretation so as to encompass all such modifications and similar structure.

What is claimed is:

1. A method of forming a tunnel oxide layer, comprising:
   providing a substrate;
   performing a rapid thermal oxidation step to form a silicon dioxide film on the substrate, wherein the rapid thermal oxidation step is performed by controlling a first parameter, and the first parameter comprises:
   a first reactive temperature between about 850 and about 1100;
   a first pressure between about 5 torr and about 15 torr; and
   a first reactive gas, and the first reactive gas comprises hydrogen, oxygen, and nitrogen, wherein a flow ratio of hydrogen of the first reactive gas to the combination of oxygen of the first reactive gas and hydrogen of the first reactive gas is between about 1% and about 33%; and
   performing a rapid annealing step on the silicon dioxide film on the substrate, wherein the rapid annealing step is performed by controlling a second parameter, and the second parameter comprises:
   a second reactive temperature between about 850 and about 1100;
   a second pressure between about 700 torr and about 760 torr; and
   a second reactive gas, wherein the second reactive gas comprises nitrogen and oxygen, and the flow rate of nitrogen of the second reactive gas is about 5 sccm and about 10 sccm, and the flow rate of oxygen of the second reactive gas is about 0.2 sccm and about 0.5 sccm.

2. The method according to claim 1, wherein the rapid thermal oxidation step is performed by using a rapid heater.

3. The method according to claim 2, wherein the rapid annealing step is performed by using the rapid heater.

4. The method according to claim 1, wherein the rapid annealing step is performed after the rapid thermal oxidation step, and the rapid annealing step is performed in an in-situ method.

* * * * *